United States Patent [19]
Klas et al.

[11] Patent Number: 5,432,484
[45] Date of Patent: Jul. 11, 1995

[54] CONNECTOR FOR COMMUNICATION SYSTEMS WITH CANCELLED CROSSTALK

[75] Inventors: Daniel E. Klas, Black Mtn., N.C.; William J. Rose, West Hartford, Conn.

[73] Assignee: Hubbell Incorporated, Orange, Conn.

[21] Appl. No.: 932,194

[22] Filed: Aug. 20, 1992

[51] Int. Cl.⁶ .................... H03H 7/00; H04M 1/74
[52] U.S. Cl. ............................ 333/1; 333/5; 333/12; 379/332; 379/417; 439/607; 439/676; 439/894
[58] Field of Search ............... 333/1, 12, 4, 5; 174/32–34; 307/89–91; 379/417, 332; 439/676, 607, 894.1

[56] References Cited

U.S. PATENT DOCUMENTS

| | | | |
|---|---|---|---|
| 2,943,272 | 6/1960 | Feldman | 333/12 |
| 3,496,555 | 2/1970 | Jones . | |
| 3,757,028 | 9/1973 | Schessel | 174/33 |
| 3,761,842 | 9/1973 | Gandrud | 333/1 |
| 3,891,815 | 6/1975 | Hiele | 200/175 |
| 4,367,908 | 1/1983 | Johnston | 439/676 |
| 4,413,469 | 11/1983 | Paquin | 57/273 |
| 4,481,379 | 11/1984 | Bolick . | |
| 4,689,441 | 8/1987 | Dick . | |
| 4,767,338 | 8/1988 | Dennis et al. | 439/55 |
| 4,785,135 | 11/1988 | Ecker | 174/34 |
| 4,831,497 | 5/1989 | Webster | 361/406 |
| 4,850,887 | 7/1989 | Sugawara | 439/108 |
| 5,027,088 | 6/1991 | Shimizu et al. | 333/1 |
| 5,039,824 | 8/1991 | Takashima | 174/33 |
| 5,124,567 | 6/1992 | Fujita et al. | 333/12 X |
| 5,186,647 | 2/1993 | Denkmann et al. | 439/395 |
| 5,226,835 | 7/1993 | Baker | 439/403 |
| 5,269,708 | 12/1993 | DeYoung | 439/676 |
| 5,299,956 | 4/1994 | Brownell et al. | 439/676 X |

FOREIGN PATENT DOCUMENTS

| | | |
|---|---|---|
| 0525703 | 2/1983 | European Pat. Off. . |
| 1382013 | 1/1975 | United Kingdom . |
| 1440392 | 6/1976 | United Kingdom . |
| 1449209 | 9/1976 | United Kingdom . |
| 2089122 | 6/1983 | United Kingdom . |

OTHER PUBLICATIONS

Principles of Electricity applied to Telephone and Telegraph Work, American Telephone and Telegraph Co., Jun. 1961.

Primary Examiner—Paul Gensler
Attorney, Agent, or Firm—Jerry M. Presson; Mark S. Bicks

[57] ABSTRACT

A connector for communications systems has four input terminals and four output terminals, each arranged in an ordered array. A circuit electrically couples each input terminal to the respective output terminal and cancels crosstalk induced across the adjacent connector terminals. The circuit includes four conductive paths between the respective pairs of terminals. The first and third paths are in relatively close proximity and are substantially spaced from the second and fourth paths. The second and fourth paths are in relatively close proximity.

25 Claims, 2 Drawing Sheets

CONNECTOR FOR COMMUNICATION SYSTEMS WITH CANCELLED CROSSTALK

FIELD OF THE INVENTION

The present invention relates to connectors for communication systems in which crosstalk induced between adjacent terminals of the connectors is cancelled. More particularly, the present invention relates to connectors with plural pairs of input and output terminals in which the respective input and output terminals are connected in a manner to cancel the effects of induced crosstalk.

BACKGROUND OF THE INVENTION

Due to advancements made in telecommunications and data transmission speeds (up to 100 MHz) over unshielded twisted pair cables, the connectors (jacks, patch panels, cross connects, etc.) have become a critical impediment to high performance data transmission at the higher frequencies, i.e., greater than 1 MHz. Some performance characteristics (particularly near end crosstalk) degrades beyond acceptable levels at these higher frequencies.

When an electrical signal is carried on a signal line which is in close proximity to another signal line or lines, such as in the case of adjacent pins or terminals in a connector, energy from one signal line can be coupled onto adjacent signal lines by means of the electric field generated by the potential between two signal lines and the magnetic field generated as a result of the changing electric fields. This coupling, whether capacitive or inductive, is called crosstalk when this phenomenon occurs between two or more signal lines.

Crosstalk is a noise signal and degrades the signal-to-noise margin (S/N) of a system. In communications systems, reduced S/N margin results in greater error rates in the information conveyed on a signal line.

One way to overcome this crosstalk problem is to increase the spacing between the signal lines. Another method commonly used is to shield the individual signal lines. However in many cases, the wiring is pre-existing and standards define the geometries and pin definitions for connectors making the necessary changes to such systems cost prohibitive. In the specific case of communications systems using unshielded twisted pair wiring, certain standards defining connector geometries and pinout definitions were created prior to the need for high speed data communications.

These standards have created a large installed base of wiring and connectors and a need for connectors capable of meeting the requirements of today's high speed communications, while maintaining compatibility with the original connectors. The standard connector geometries and pinouts are such that a great deal of crosstalk occurs at these higher signal frequencies.

According to Fourier's theory, when a signal is added to an equal but opposite signal, the two signals cancel each other completely. In unshielded twisted pair wiring, the two wires which are twisted about each other carry identical but opposite signals. These signals are described as being differentially driven. As one signal is driven toward a more positive voltage level, the second signal is driven in the opposite direction or toward a more negative voltage level. These signals being equal but opposite generate fields that are equal but opposite. These equal and opposite fields cancel each other with the result that little crosstalk can occur between a twisted pair and other adjacent signal lines.

In a typical connector used in unshielded twisted pair wiring systems, the signals are conveyed through connector pins or terminals which are parallel to each other for an inch or more, allowing unacceptable levels of crosstalk to occur for today's high speed data signals. These signals are typically in line with each other with the fields from one signal line being coupled onto the one or two immediately adjacent lines. If a noise signal equal, but opposite to, the crosstalk coupled signal is induced onto the affected line, the two induced signals thus coupled will cancel each other. Since the connector carries complementary pairs of signals (i.e. two differentially driven signals of a twisted pair wiring), noise coupled from one line of one pair onto an adjacent line can be canceled by also coupling an equal amount of "noise" from its complement.

SUMMARY OF THE INVENTION

An object of the present invention is to provide a connector for communication systems which will effectively cancel crosstalk induced across the connector terminals.

Another object of the present invention is to provide a connector without net crosstalk between the connector terminals without shielding and without changing the standard connector geometry and pinout definitions.

A further object of the present invention is to provide a connector without crosstalk between the connector terminals which is simple and inexpensive to manufacture and use.

The foregoing objects are basically obtained by a connector for communications systems, comprising first, second, third and fourth input terminals arranged in an ordered array, first, second, third and fourth output terminals arranged in an ordered array, and circuit means for electrically coupling each of the input terminals to the respective output terminal and for cancelling crosstalk induced across the adjacent connector terminals. The circuit means includes first, second, third and fourth conductive paths between the respective input and output terminals. The first and third paths are in relatively close proximity and are substantially spaced from the second and fourth paths. The second and fourth paths are in relatively close proximity.

By forming the connector in this manner, the crosstalk noise is countered without requiring new equipment and wiring. Instead, the connector design itself eliminates the crosstalk noise, regardless of whether the induced crosstalk results from an inductive coupling by means of magnetic fields or from a capacitive coupling by means of electric fields, or from a combination of both couplings.

The crosstalk noise is eliminated by, for example, the energy induced onto the second signal line from the first signal line being approximately cancelled by coupling energy to the second signal line from a third signal line in close proximity to the second signal line and carrying a signal equal to, but opposite to, the signal in the first signal line. This operation can be accomplished by either crisscrossing the pins in the connector or by adding a printed wiring board to the connector to allow signals to be run adjacent to each other in a controlled way. By adjusting the width of the printed wiring board traces, the thicknesses of the traces, the separation of adjacent traces and the dielectric constant of the medium between the adjacent traces, the amount of injected crosstalk can be adjusted to cancel that which was injected by the connector pins.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE INVENTION

Figure 1:
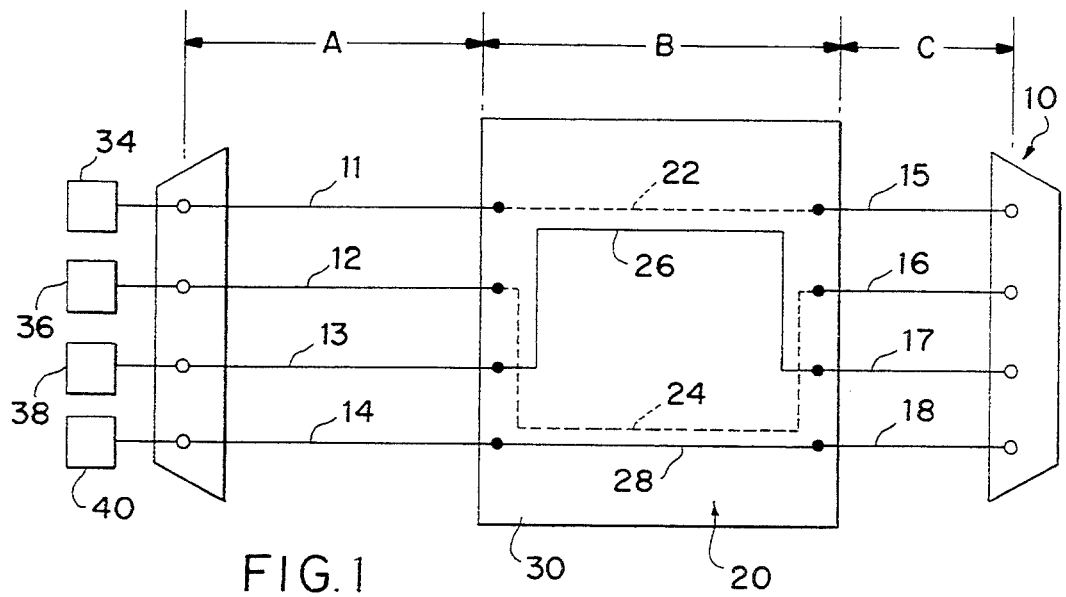
FIG. 1 is a schematic diagram of a connector for communication systems according to the present invention.

A connector 10 according to the present invention is schematically or diagrammatically illustrated in FIG. 1, with the connector divided into an input section A, a circuit section B and an output section C. The circuit section electrically couples the connector input terminals 11, 12, 13 and 14 to the output terminals 15, 16, 17 and 18, respectively, such that crosstalk induced across adjacent terminals in input section A and output section C is cancelled in circuit section B.

The input and output terminals are of conventional designs used in telephone and other communications systems for such connectors as jacks, patch panels and cross connects. The conventional details of the connector in input section A and output section C are not described in detail.

The circuit section B comprises a printed wiring board 20 with four printed circuit traces or conductive paths 22, 24, 26 and 28 printed on a substrate 30. Trace 22 extends between and connects input terminal 11 and output terminal 15. Trace 24 extends between and connects input terminal 12 and output terminal 16. Trace 26 extends between and connects input terminal 13 and output terminal 17. Trace 28 extends between an connects input terminal 14 and output terminal 18.

In circuit board 20, traces 22 and 26 are in close proximity to each other inducing crosstalk therebetween, while traces 24 and 28 are in close proximity to each other inducing crosstalk therebetween. Traces 22 and 26 are substantially spaced from traces 24 and 28 to minimize induced crosstalk between such two pairs in circuit board 20.

In input section A and output section C, the proximity of adjacent terminals induces crosstalk between the adjacent terminals. Specifically, crosstalk is induced in terminal 11 from terminal 12, in terminal 12 from terminals 11 and 13, in terminal 13 from terminals 12 and 14, in terminal 14 from terminal 13, in terminal 15 from terminal 16, in terminal 16 from terminals 15 and 17, in terminal 17 from terminals 16 and 18, and in terminal 18 from terminal 17. The spacing between the terminals is adequate to minimize crosstalk between the other or non-adjacent terminal pairs.

In a communications system, terminals 11, 12, 13, and 14 are connected to signal sources 34, 36, 38 and 40, respectively. The signals from sources 34 and 40 are equal and opposite (i.e., differently driven) to each other. The signals from sources 36 and 38 are equal and opposite to each other. With the application of these two pairs of opposite or differently driven signals, the crosstalk induced in printed wiring board 20 in circuit section B tends to cancel the crosstalk induced across and between the respective input and output terminals in the input and output sections A and B of the connector.

The length and separation of traces 22, 26, 28 and 30, the thickness and width of each trace, the thickness of substrate 30 (assuming traces are provided on both sides of the substrate), and the dielectric constant of the printed wiring board can be adjusted. With appropriate adjustment of those factors, the crosstalk signals induced between traces 22 and 26 and between traces 24 and 28 can be controlled to cancel, at least approximately, the effects of the induced signals or crosstalk resulting from the proximity of the terminals in input section A and output section C. The factors can also be adjusted to compensate for wiring crosstalk.

The formulas for determining characteristic impedance to estimate crosstalk are presented in Handbook of Analog Circuit Design by Dennis L. Feucht, Academic Press, Inc., Harcourt Brace Javanovich, Publishers, 1990, pp. 387–393, the subject matter of which is incorporated herein by reference, and include the following:

For twisted pair wiring $$Z_n \cong \frac{120 \, \Omega}{\sqrt{\epsilon_r}} \ln\left(\frac{h}{d}\right)$$

where
$Z_n$ = characteristic impedance
$\epsilon_r$ = dielectric constant
h = distance between conductor centers
d = conductor diameter For traces extending side-by-side $$Z_n = \frac{120 \, \Omega}{\sqrt{\epsilon_r}} \ln\left(\frac{\pi h}{w + d}\right), \text{ for } w >> d$$

where
$Z_n$ = characteristic impedance
$\epsilon_r$ = dieletric constant
h = edge to edge spacing of traces
w = trace width
d = trace thickness For traces on opposite sides of a printed wiring or circuit board $$Z_n \cong \frac{377 \, \Omega}{\sqrt{\epsilon_r}} \left(\frac{h}{w}\right), \text{ for } w >> h >> d$$

where
$Z_n$ = characteristic impedance
$\epsilon_r$ = dielectric constant
w = trace width h = board thickness
d = trace thickness The circuit section which will compensate for terminal crosstalk can also comprise wiring, in lieu of the printed circuit board, if the routing of the wire is appropriately controlled. Alternatively, the rerouting of the conductive paths between the respective input and output terminals can be achieved using portions of the connector terminals themselves between the male and female connection portions thereof.

Although the schematic of FIG. 1 shows only two pairs of terminals and traces, any number of pairs can be provided.

Figure 2:
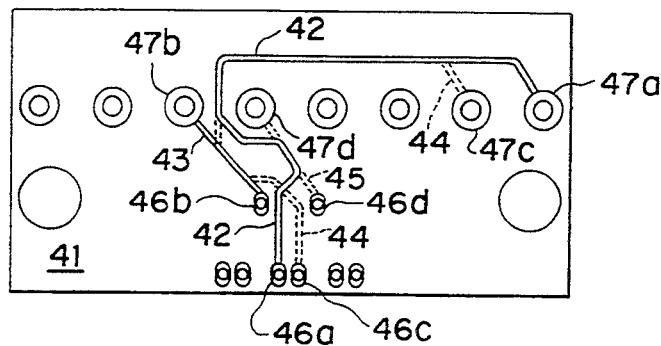
FIG. 2 is a plan view of a printed wiring board of a connector according to a first embodiment of the present invention.

FIG. 2 illustrates a printed wiring board with an over/under energy transfer mode. In this mode, substrate 41 has conductive traces 42 and 43 on one side and conductive traces 44 and 45 on the opposite side between terminal connection points 46 a–d and 47 a–d. Portions of trace 42 directly overlie portions of trace 45, while portions of trace 43 directly overlie portions of trace 44. Trace 42 extends between points 46a and 47a. Trace 43 extends between points 46b and 47b. Trace 44 extends between points 46c and 47c. Trace 45 extends between points 46d and 47d. Traces 43, 42, 44 and 45 correspond generally to traces 22–28, respectively, of FIG. 1.

Figure 3:
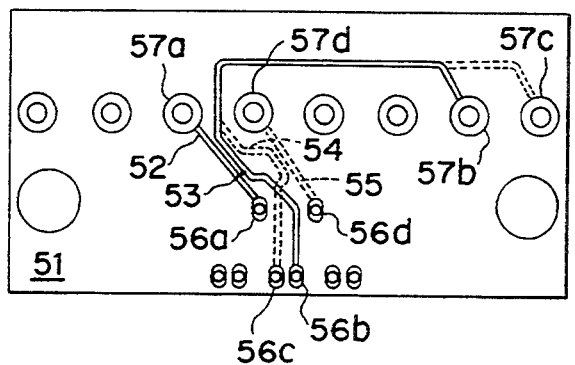
FIG. 3 is a plan view of a printed wiring board of a connector according to a second embodiment of the present invention.

FIG. 3 illustrates a printed wiring board with a side-by-side energy transfer mode. In this mode, substrate 51 has conductive traces 52 and 53 on one side and conductive traces 54 and 55 on the opposite side between terminal connection points 56 a–d and 57 a–d. A portion of trace 52 is slightly laterally offset from a portion of trace 53, while a portion of trace 54 is slightly laterally offset from a portion of trace 55. Trace 52 extends between points 56a and 57a. Trace 53 extends between points 56b and 57b. Trace 54 extends between points 56c and 57c. Trace 55 extends between points 56d and 57d. Traces 52, 54, 53 and 55 correspond generally to traces 22–28, respectively, of FIG. 1.

Figure 4:
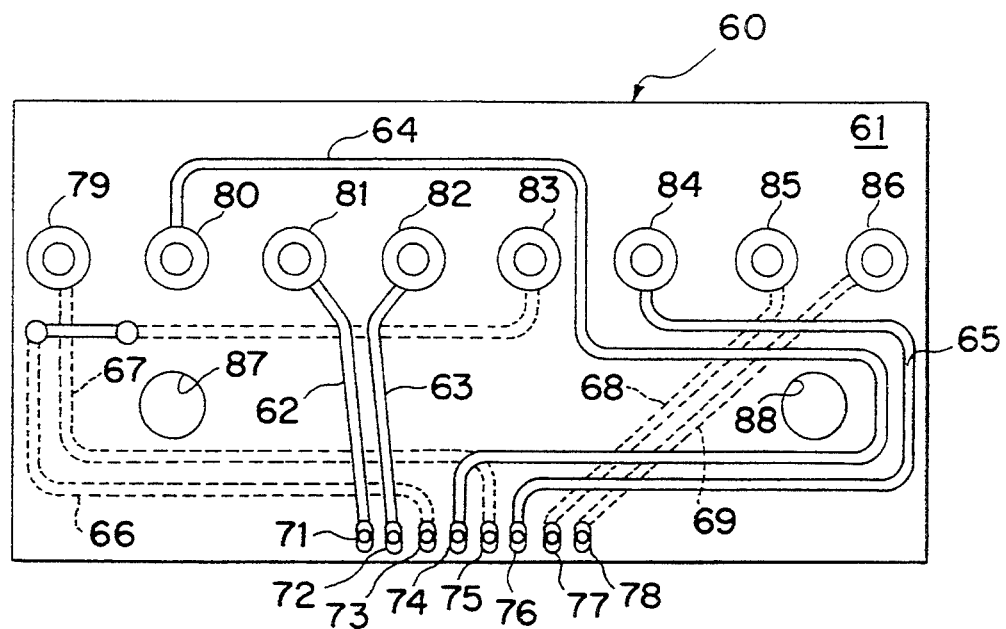
FIG. 4 is a plan view of a printed wiring board of a connector according to a third embodiment of the present invention.

FIG. 4 illustrates a printed wiring board 60 for a connector known as a keystone jack to be operated at a 20 MHz frequency range. This board includes a substrate 61 with conductive traces 62, 63, 64 and 65 on one side and conductive traces 66, 67, 68 and 69 on the opposite side extending between terminal points or pads 70–86. Trace 62 extends between points 71 and 81. Trace 63 extends between points 72 and 82. Trace 64 extends between points 74 and 80. Trace 65 extends between points 76 and 84. Trace 66 extends between points 73 and 83. Trace 67 extends between points 75 and 79. Trace 68 extends between points 77 and 85. Trace 69 extends between points 78 and 86. The trace pairs in close proximity for inducing crosstalk are traces 62 and 63, traces 64 and 65, traces 66 and 67 and traces 68 and 69. The trace width is typically 0.015 inch, with the trace being ½ ounce copper plated up to 0.0014–0.002 inch. The trace spacing is typically 0.020 inch between adjacent traces in close proximity. Points 71–78 are ovals of 0.022 inch by 0.050 inch. Points 79–86 have 0.080 inch diameters. Points 79–86 are typically spaced on 0.15 inch centers. Points 71–78 are typically spaced on 0.040 inch centers. The perpendicular distance between a line through the centers of points 71–78 and a line through the centers of points 79–86 is 0.349 inch. The maximum lateral spacing of the center lines of traces 66 and 65 is 1.120 inches. The portion of the center line of trace 64 on the side of points 79–86 remote from points 71–78 is spaced 0.469 inch from the line through the centers of points 71–78. Substrate 61 is 0.047 inch thick with a dielectric constant of 4.5 at 1 MHz. Tooling holes 87 and 88 are provided in substrate 61. Traces 66, 64, 67 and 65 correspond generally to traces 22–28, respectively, of FIG. 1.

The printed wiring board is printed on both sides to provide a good layout. However, all traces can be printed on a single side of the substrate. Also a combination of the over/under and side-by-side modes can be used.

While various embodiments have been chosen to illustrate the invention, it will be understood by those skilled in the art that various changes and modifications can be made therein without departing from the scope of the invention as defined in the appended claims.

What is claimed is:

1. A connector for communications systems, comprising:
   first, second, third and fourth input terminals arranged in a first ordered array with said second and third input terminals being between said first and fourth input terminals;
   first, second, third and fourth output terminals arranged in a second ordered array; and
   circuit means for electrically coupling said first, second, third and fourth input terminals to said first, second, third and fourth output terminals, respectively, and for canceling crosstalk induced across adjacent ones of said terminals, said circuit means including first, second, third and fourth conductive paths between said first, second, third and fourth terminals, respectively, sections of said first and third paths being in relatively close proximity and being substantially spaced from said second and fourth paths, sections of said second and fourth paths being in relatively close proximity, said second and third paths being in relatively close proximity at connections thereof with said second and third input terminals and crossing over each other between said input terminals and said output terminals.

2. A connector according to claim 1 wherein said conductive paths are parallel.

3. A connector according to claim 1 wherein said circuit means comprises a printed wiring board with a substrate and printed conductive traces.

4. A connector according to claim 3 wherein
   said first and third conductive paths are on one side of said substrate; and
   said second and fourth conductive paths are on a second, opposite side of said substrate.

5. A connector according to claim 4 wherein portions of said first and third conductive paths and of said second and fourth conductive paths, respectively, are directly over one another.

6. A connector according to claim 4 wherein portions of said first and third conductive paths and of said second and fourth conductive paths, respectively, are laterally offset.

7. A connector according to claim 1 wherein said first and fourth input terminals are respectively coupled to sources of equal and opposite signals.

8. A connector according to claim 7 wherein said second and third input terminals are respectively coupled to sources of equal and opposite signals.

9. A connector according to claim 1 wherein said conductive paths have lengths and widths and are relatively spaced such that induced crosstalk is approximately cancelled.

10. A connector according to claim 1 wherein
the first ordered array is in the same order as the second ordered array.

11. A connector according to claim 1 wherein
distances between said sections of said first and third paths and between said sections of said second and fourth paths are substantially less than distances of said sections of said first and third paths from said sections of said second and fourth paths.

12. A connector according to claim 1 wherein
said first and fourth input terminals form a first signal conducting pair; and
said second and third input terminals form a second signal conductive pair.

13. A connector according to claim 1 wherein
said second and third paths cross at a point between said first and fourth paths.

14. A connector for communications systems, comprising:
first, second, third and fourth input terminals arranged in a first ordered array with said second and third input terminals being between said first and fourth input terminals;
first, second, third and fourth output terminals arranged in a second ordered array; and
printed wiring board means for electrically coupling said first, second, third and fourth input terminals to said first, second, third and fourth output terminals, respectively, said board means including a substrate having first, second, third and fourth conductive paths printed thereon between said first, second, third and fourth terminals, respectively, said first and third paths being in relatively close proximity and being substantially spaced from said second and fourth paths in an area of said board means, said second and fourth paths being in relatively close proximity in said area of said board means, said second and third paths being in relatively close proximity at connections thereof with said second and third input terminals and crossing each other between said input terminals and said output terminals;
said conductive paths having lengths and widths and being relatively spaced on said substrate, and said substrate having a dielectric constant such that any induced crosstalk is approximately cancelled.

15. A connector according to claim 14 wherein said first and fourth input terminals are respectively coupled to sources of equal and opposite signals.

16. A connector according to claim 15 wherein said second and third input terminals are respectively coupled to sources of equal and opposite signals.

17. A connector according to claim 14 wherein the first ordered array is in the same order as the second ordered array.

18. A connector according to claim 14 wherein
distances between said first and third paths and between said second and fourth paths are substantially less than distances of said first and third paths from said second and fourth paths in said area of said board means.

19. A connector according to claim 14 wherein
said first and fourth input terminals form a first signal conducting pair; and
said second and third input terminals form a second signal conductive pair.

20. A connector according to claim 14 wherein
said second and third paths cross at a point between said first and fourth paths.

21. A connector for communications systems, comprising:
first, second, third and fourth input terminals arranged in a first ordered array;
first, second, third and fourth output terminals arranged in a second ordered array; and
printed wiring board means for electrically coupling said first, second, third and fourth input terminals to said first, second, third and fourth output terminals, respectively, said board means including a dielectric substrate having first, second, third and fourth conductive paths printed thereon between said first, second, third and fourth terminals, respectively, said first and third paths being in relatively close proximity and being substantially spaced from said second and fourth paths in an area of said board means, said second and fourth paths being in relatively close proximity in said area of said board means, said first and third conductive paths being on one side of said substrate, said second and fourth conductive paths being on a second, opposite side of said substrate;
said conductive paths having lengths and widths and being relatively spaced by thicknesses of said substrate, and said substrate having a dielectric constant such that any induced crosstalk is approximately cancelled.

22. A connector according to claim 21 wherein
portions of said first and third conductive paths and of said second and fourth conductive paths, respectively, are directly over one another.

23. A connector according to claim 21 wherein
portions of said first and third conductive paths and of said second and fourth conductive paths, respectively, are laterally offset.

24. A connector according to claim 21 wherein
said first and fourth input terminals are respectively coupled to sources of equal and opposite signals.

25. A connector according to claim 24 wherein
said second and third input terminals are respectively coupled to sources of equal and opposite signals.

* * * * *